(12) United States Patent
You et al.

(10) Patent No.: US 12,198,784 B2
(45) Date of Patent: Jan. 14, 2025

(54) SEMICONDUCTOR DEVICE RELATED TO CALIBRATING A TERMINATION RESISTANCE

(71) Applicant: SK hynix Inc., Icheon-si Gyeonggi-do (KR)

(72) Inventors: Jung Taek You, Icheon-si Gyeonggi-do (KR); Sang Sic Yoon, Icheon-si Gyeonggi-do (KR); Kyu Dong Hwang, Icheon-si Gyeonggi-do (KR); Chae Sung Lim, Icheon-si Gyeonggi-do (KR); Saeng Hwan Kim, Icheon-si Gyeonggi-do (KR); Hong Joo Song, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 114 days.

(21) Appl. No.: 18/116,001

(22) Filed: Mar. 1, 2023

(65) Prior Publication Data
US 2023/0335168 A1 Oct. 19, 2023

(30) Foreign Application Priority Data

Apr. 19, 2022 (KR) .................. 10-2022-0048459
May 4, 2022 (KR) .................. 10-2022-0055763
Oct. 11, 2022 (KR) .................. 10-2022-0130003

(51) Int. Cl.
*G11C 7/22* (2006.01)
*G06F 13/16* (2006.01)
(Continued)

(52) U.S. Cl.
CPC .......... *G11C 7/222* (2013.01); *G06F 13/1673* (2013.01); *G06F 13/1689* (2013.01);
(Continued)

(58) Field of Classification Search
CPC ..... G11C 7/222; G11C 7/1048; G11C 7/1057; G11C 2207/2254; G11C 7/1084;
(Continued)

(56) References Cited

U.S. PATENT DOCUMENTS 10,318,464 B1  6/2019  Jiang et al.
10,529,390 B1 * 1/2020 Satoh ............... G11C 29/50008
(Continued)

FOREIGN PATENT DOCUMENTS

KR  1020210070557 A  6/2021

*Primary Examiner* — Fernando Hidalgo
(74) *Attorney, Agent, or Firm* — WILLIAM PARK & ASSOCIATES LTD.

(57) ABSTRACT

A semiconductor system includes a controller configured to transmit a command address and a plurality of read strobe signals, and a semiconductor device including a first rank and a second rank that are configured to receive the command address and the plurality of read strobe signals and to perform a write operation and a read operation based on the command address. In the semiconductor device, the first rank is configured to calibrate a termination resistance value of the first rank to a target resistance value when a write operation for the first rank is performed. In the semiconductor device, the first rank is configured to calibrate the termination resistance value of the first rank to a dynamic resistance value based on the plurality of read strobe signals when a write operation for the second rank is performed.

20 Claims, 11 Drawing Sheets

(51) Int. Cl.
*G06F 13/40* (2006.01)
*G11C 7/10* (2006.01)

(52) U.S. Cl.
CPC ........ *G06F 13/4086* (2013.01); *G11C 7/1048* (2013.01); *G11C 7/1057* (2013.01); *G11C 2207/2254* (2013.01)

(58) Field of Classification Search
CPC ................ G11C 29/022; G11C 29/028; G11C 29/50008; G06F 13/1673; G06F 13/1689; G06F 13/4086
USPC ......................................................... 365/193
See application file for complete search history.

(56) References Cited

U.S. PATENT DOCUMENTS

| | | | | |
|---|---|---|---|---|
| 2018/0053567 | A1* | 2/2018 | Kim | G11C 29/022 |
| 2020/0310689 | A1* | 10/2020 | Park | G11C 7/1048 |
| 2021/0151117 | A1* | 5/2021 | Kim | G11C 29/028 |
| 2021/0166743 | A1 | 6/2021 | Itagaki | |
| 2021/0175887 | A1* | 6/2021 | Hiemstra | G11C 7/1006 |
| 2022/0059148 | A1* | 2/2022 | Kim | G11C 7/1057 |
| 2022/0284946 | A1* | 9/2022 | Kang | G11C 29/022 |
| 2023/0420008 | A1* | 12/2023 | Tian | G11C 29/022 |

\* cited by examiner

SEMICONDUCTOR DEVICE RELATED TO CALIBRATING A TERMINATION RESISTANCE

CROSS-REFERENCE TO RELATED APPLICATIONS

The present application claims priority under 35 U.S.C. 119(a) to Korean Patent Application No. 10-2022-0048459, filed on Apr. 19, 2022, Korean Patent Application No. 10-2022-0055763, filed on May 4, 2022, and Korean Patent Application No. 10-2022-0130003, filed on Oct. 11, 2022, which are incorporated herein by reference in their entirety.

BACKGROUND

1. Technical Field

Embodiments of the present disclosure relate to a semiconductor device, and more particularly, to a semiconductor device related to calibrating a termination resistance.

2. Related Art

In the case of a semiconductor device, a command and an address are input in synchronization with a clock. A double data rate (DDR) type semiconductor device receives the command and address in synchronization with a rising edge and a falling edge of the clock, and a single data rate (SDR) type semiconductor device receives the command and address in synchronization with a rising edge of the clock.

Meanwhile, the semiconductor device is implemented to include a plurality of ranks sharing input/output lines, and performs an on-die termination (ODT) operation to prevent or mitigate signal reflection of the shared input/output lines. Accordingly, commands for controlling the on-die termination (ODT) operation have been added.

SUMMARY

An embodiment of the present disclosure may provide a semiconductor system including a controller configured to transmit a command address and a plurality of read strobe signals, and a semiconductor device including a first rank and a second rank that are configured to receive the command address and the plurality of read strobe signals and to perform a write operation and a read operation based on the command address, wherein the first rank is configured to calibrate a termination resistance value of the first rank to a target resistance value when a write operation for the first rank is performed, and the first rank is configured to calibrate the termination resistance value of the first rank to a dynamic resistance value based on the plurality of read strobe signals when a write operation for the second rank is performed.

In addition, an embodiment of the present disclosure may provide a semiconductor system including a controller configured to transmit a command address and a read strobe signals, and a semiconductor device including a first rank and a second rank that are configured to receive the command address and the read strobe signals and to perform a write operation and a read operation based on the command address, wherein the first rank is configured to calibrate a termination resistance value of the first rank to a target resistance value when a write operation for the first rank is performed, and the first rank is configured to calibrate the termination resistance value of the first rank to a dynamic resistance value based on the read strobe signals when a write operation for the second rank is performed.

In addition, an embodiment of the present disclosure may provide a semiconductor device including a first rank and a second rank, each of the first rank and the second rank being configured to perform a write operation and a read operation based on a command address, wherein the first rank is configured to calibrate a termination resistance value of the first rank to a target resistance value when a write operation for the first rank is performed, and the first rank is configured to calibrate the termination resistance value of the first rank to a dynamic resistance value based on at least one read strobe signal when a write operation for the second rank is performed.

DETAILED DESCRIPTION OF THE EMBODIMENTS

In the following description of embodiments, when a parameter is referred to as being "predetermined" or "preset" it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
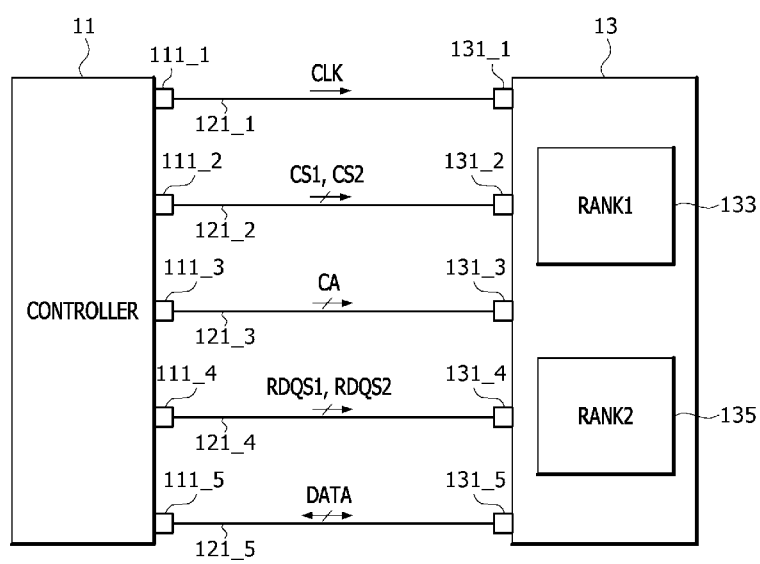
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As shown in FIG. 1, the semiconductor system 1 may include a controller 11 and a semiconductor device 13.

The controller 11 may include a first control pin 111_1, a second control pin 111_2, a third control pin 111_3, a fourth control pin 111_4, and a fifth control pin 111_5. The semiconductor device 13 may include a first device pin 131_1, a second device pin 131_2, a third device pin 131_3, a fourth device pin 131_4, and a fifth device pin 131_5. The controller 11 may transmit a clock CLK to the semiconductor device 13 through a first transmission line 121_1 connected between the first control pin 111_1 and the first device pin 131_1. The controller 11 may transmit chip selection signals CS1 and CS2 to the semiconductor device 13 through a second transmission line 121_2 connected between the second control pin 111_2 and the second device pin 131_2. The second transmission line 121_2 may be separately provided for each of the chip selection signals CS1 and CS2. The controller 11 may transmit a command address CA to the semiconductor device 13 through a third transmission line 121_3 connected between the third control pin 111_3 and the third device pin 131_3. In the present embodiment, the command address CA may include a command for performing internal operations including a write operation, a read operation, and the like and an address including a bank address, a row address, a column address, and the like. Each of the third control pin 111_3, the third transmission line 121_3, and the third device pin 131_3 may be implemented in plurality according to the number of bits of the command address CA. The controller 11 may transmit read strobe signals RDQS1 and RDQS2 to the semiconductor device 13 through a fourth transmission line 121_4 connected between the fourth control pin 111_4 and the fourth device pin 131_4. The fourth transmission line 121_4 may be separately provided for each of the read strobe signals RDQS1 and RDQS2. The controller 11 may transmit transmission data DATA to the semiconductor device 13 through a fifth transmission line 121_5 connected between the fifth control pin 111_5 and the fifth device pin 131_5. The controller 11 may receive the transmission data DATA from the semiconductor device 13 through the fifth transmission line 121_5 connected between the fifth control pin 111_5 and the fifth device pin 131_5. Each of the fifth control pin 111_5, the fifth device pin 131_5, and the fifth transmission line 121_5 may be implemented in plurality according to the number of bits of the transmission data DATA.

The semiconductor device 13 may include a first rank 133 and a second rank 135. Each of the first rank 133 and the second rank 135 may perform a write operation of receiving and storing the transmission data DATA, and may perform a read operation of outputting the transmission data DATA to the controller 11, based on the clock CLK, the chip selection signals CS1 and CS2, and the command address CA that are received from the controller 11. Each of the first rank 133 and the second rank 135 may calibrate a termination resistance value thereof to a preset target resistance value (T_ODT of FIG. 4) when a write operation is performed. Here, the termination resistance value may refer to a resistance value of a termination resistor provided for impedance matching at a receiving end (not shown) at which the transmission data DATA is received during the write operation. Each of the first rank 133 and the second rank 135 may calibrate each termination resistance value to a preset non-target resistance value (NT_ODT of FIG. 4) when a write operation is not performed or at least one of the read strobe signals RDQS1 and RDQS2 is not at a preset logic level. The first rank 133 may calibrate the termination resistance value of the first rank 133 to a preset dynamic resistance value (D_ODT of FIG. 4) when a write operation of the second rank 135 is performed. The second rank 135 may calibrate the termination resistance value of the second rank 135 to a preset dynamic resistance value (D_ODT of FIG. 4) when a write operation of the first rank 133 is performed.

Figure 2:
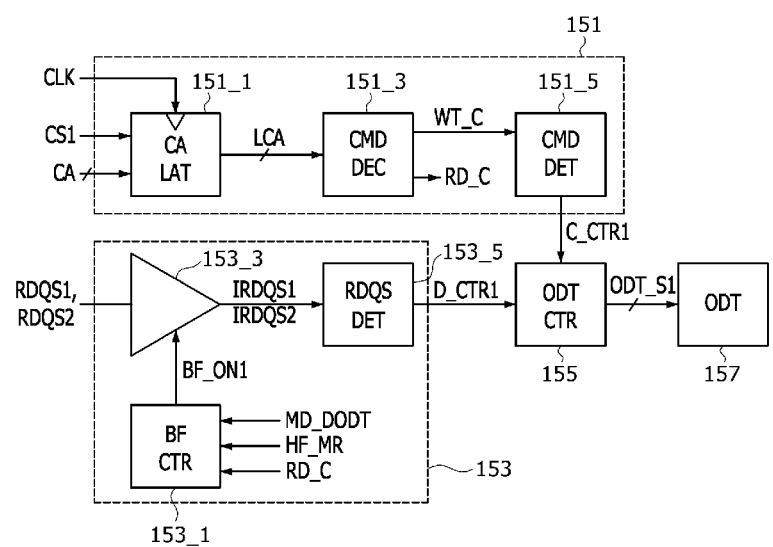
FIG. 2 is a block diagram illustrating a configuration of a first rank according to an embodiment of the present disclosure.

FIG. 2 is a block diagram illustrating a configuration of a first rank 133A according to an example of the first rank 133 shown in FIG. 1. As shown in FIG. 2, the first rank 133A may include a command control signal generation circuit 151, a dynamic control signal generation circuit 153, a termination control circuit 155, and a termination circuit 157.

The command control signal generation circuit 151 may generate a first command control signal C_CTR1 that is activated when a write operation of the first rank 133A is performed. To this end, the command control signal generation circuit 151 may include a command address latch circuit (CA LAT) 151_1, a command decoder (CMD DEC) 151_3, and a command detection circuit (CMD DET) 151_5. The command address latch circuit 151_1 may generate a latch command address LCA from a command address CA based on a clock CLK and a first chip selection signal CS1. The command address latch circuit 151_1 may latch the command address CA in synchronization with the clock CLK when the first chip selection signal CS1 is activated for various internal operations including a write operation and a read operation of the first rank 133A, and may output the latched command address CA as the latch command address LCA. The command address latch circuit 151_1 may be connected to the command decoder 151_3 to apply the latch command address LCA to the command decoder 151_3. The command decoder 151_3 may generate a write command WT_C and a read command RD_C from the latch command address LCA that is received from the command address latch circuit 151_1. The command decoder 151_3 may decode the latch command address LCA to generate the write command WT_C for a write operation of the first rank 133A and to generate the read command RD_C for a read operation of the first rank 133A. The command decoder 151_3 may be connected to the command detection circuit 151_5 and a buffer control signal generation circuit (BF CTR) 153_1 to apply the write command WT_C to the command detection circuit 151_5 and to apply the read command RD_C to the buffer control signal generation circuit 153_1. The command detection circuit 151_5 may generate a first command control signal C_CTR1 based on the write command WT_C. The command detection circuit 151_5 may generate a first command control signal C_CTR1 that is activated when the write command WT_C is generated for the write operation of the first rank 133A. The command detection circuit 151_5 may be connected to the termination control circuit 155 to apply the first command control signal C_CTR1 to the termination control circuit 155.

The dynamic control signal generation circuit 153 may generate a first dynamic control signal D_CTR1 that is enabled to set a termination resistance value of the first rank 133A to a preset dynamic resistance value (D_ODT in FIG. 4), based on a first read strobe signal RDQS1 and a second read strobe signal RDQS2 in a state in which the write operation of the second rank 135 is performed and a dynamic termination mode or a high-frequency mode is entered. To this end, the dynamic control signal generation circuit 153 may include the buffer control circuit (BF_CTR) 153_1, a buffer circuit 153_3, and a read strobe signal detection circuit (RDQS DET) 153_5. The buffer control circuit 153_1 may generate a first buffer enable signal BF_ON1 based on a dynamic termination mode signal MD_DODT, a high-frequency mode signal HF_MR, and a read command RD_C. The dynamic termination mode signal MD_DODT may be activated in a dynamic termination mode for setting a termination resistance value of a non-target rank to a dynamic resistance value (D_ODT in FIG. 4), and the high-frequency mode signal HF_MR may be activated in a high-frequency mode in which an operating frequency is set to be high. Whether the dynamic termination mode signal MD_DODT and the high-frequency mode signal HF_MR are activated may be determined through a test mode or a mode register set operation. The buffer control circuit 153_1 may generate a first buffer enable signal BF_ON1 that is activated when entering the dynamic termination mode by the dynamic termination mode signal MD_DODT or entering the high-frequency mode by the high-frequency mode signal HF_MR. The buffer control circuit 153_1 may generate a first buffer enable signal BF_ON1 that is deactivated at a time point when a preset buffer control period elapses when a read operation for the first rank 133A is performed and a read command RD_C is generated. The buffer control period may be set in consideration of a period in which the first read strobe signal RDQS1 and the second read strobe signal RDQS2 are received in order to calibrate the termination resistance value. The buffer control circuit 153_1 may be connected to the buffer circuit 153_3 to apply the first buffer enable signal BF_ON1 to the buffer circuit 153_3. The buffer circuit 153_3 may receive the first read strobe signal RDQS1 and the second read strobe signal RDQS2 based on the first buffer enable signal BF_ON1 to generate a first internal read strobe signal IRDQS1 and a second internal read strobe signal IRDQS2. The buffer circuit 153_3 may buffer the first read strobe signal RDQS1 to generate the first internal read strobe signal IRDQS1, and may buffer the second read strobe signal RDQS2 to generate the second internal read strobe signal IRDQS2 when the first buffer enable signal BF_ON1 is activated. The buffer circuit 153_3 may be connected to the read strobe signal detection circuit 153_5 to apply the first internal read strobe signal IRDQS1 and the second internal read strobe signal IRDQS2 to the read strobe signal detection circuit 153_5. The read strobe signal detection circuit 153_5 may generate a first dynamic control signal D_CTR1 based on the first internal read strobe signal IRDQS1 and the second internal read strobe signal IRDQS2. More specifically, the read strobe signal detection circuit 153_5 may generate the first dynamic control signal D_CTR1 that is activated when each of the first internal read strobe signal IRDQS1 and the second internal read strobe signal IRDQS2 is set to have a preset logic level. For example, the read strobe signal detection circuit 153_5 may generate the first dynamic control signal D_CTR1 that is activated when both the first internal read strobe signal IRDQS1 and the second internal read strobe signal IRDQS2 are set to have a logic "high" level. The logic level of each of the first internal read strobe signal IRDQS1 and the second internal read strobe signal IRDQS2 may be variously set according to embodiments. The read strobe signal detection circuit 153_5 may be connected to the termination control circuit 155 to apply the first dynamic control signal D_CTR1 to the termination control circuit 155.

The termination control circuit 155 may generate a first termination resistance calibration signal ODT_S1 for calibrating a termination resistance value of the termination circuit 157, based on the first command control signal C_CTR1 that is received from the command detection circuit 151_5 and the first dynamic control signal D_CTR1 that is received from the read strobe signal detection circuit 153_5. The termination control circuit 155 may generate the first termination resistance calibration signal ODT_S1 for calibrating the termination resistance value of the termination circuit 157 to a target resistance value (T_ODT of FIG. 4) when the first command control signal C_CTR1 is activated and the first dynamic control signal D_CTR1 is deactivated. The termination control circuit 155 may generate the first termination resistance calibration signal ODT_S1 for calibrating the termination resistance value of the termination circuit 157 to a dynamic resistance value (D_ODT of FIG. 4) when the first command control signal C_CTR1 is deactivated and the first dynamic control signal D_CTR1 is activated. The termination control circuit 155 may generate the first termination resistance calibration signal ODT_S1 for calibrating the termination resistance value of the termination circuit 157 to a non-target resistance value (NT_ODT of FIG. 4) when the first command control signal C_CTR1 is deactivated and the first dynamic control signal D_CTR1 is deactivated. The termination resistance value of the termination circuit 157 may be set to a resistance value of a termination resistor (not shown) provided in the first rank 133A. By calibrating the logic bit set of bits included in the first termination resistance calibration signal ODT_S1 or by calibrating a voltage level of the first termination resistance calibration signal ODT_S1, the termination resistance value of the termination circuit 157 may be implemented to be set to have one of the target resistance value (T_ODT in FIG. 4), the dynamic resistance value (D_ODT in FIG. 4), and the non-target resistance value (NT_ODT in FIG. 4).

Figure 3:
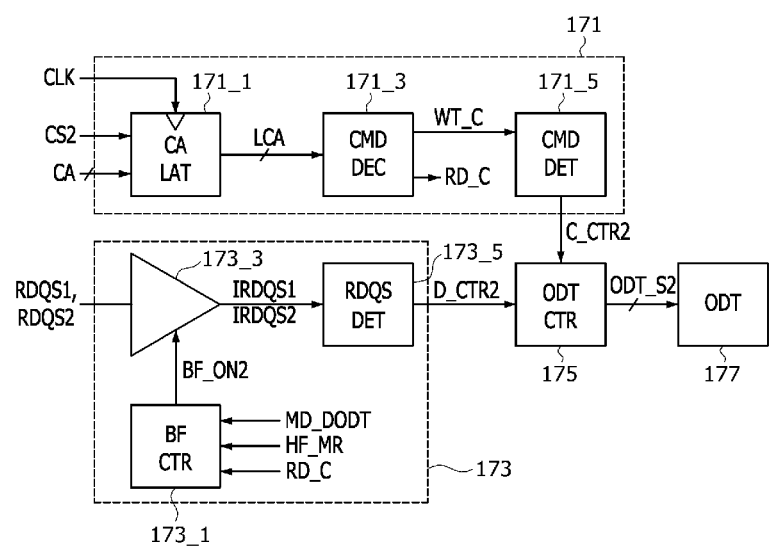
FIG. 3 is a block diagram illustrating a configuration of a second rank according to an embodiment of the present disclosure.

FIG. 3 is a block diagram illustrating a configuration of a second rank 135A according to an example of the second rank 135 shown in FIG. 1. As shown in FIG. 3, the second rank 135A may include a command control signal generation circuit 171, a dynamic control signal generation circuit 173, a termination control circuit 175, and a termination circuit 177.

The command control signal generation circuit 171 may generate a second command control signal C_CTR2 that is activated when a write operation of the second rank 135A is performed. To this end, the command control signal generation circuit 171 may include a command address latch circuit (CA LAT) 171_1, a command decoder (CMD DEC) 171_3, and a command detection circuit (CMD DET) 171_5. The command address latch circuit 171_1 may generate a latch command address LCA from a command address CA, based on a clock CLK and a second chip selection signal CS2. The command address latch circuit 171_1 may latch the command address CA in synchronization with the clock CLK when the second chip selection signal CS2 is activated for various internal operations including a write operation, a read operation, and the like of the second rank 135A, and may output the latched command address CA as the latch command address LCA. The command decoder 171_3 may generate a write command WT_C and a read command RD_C from the latch command address LCA that is received from the command address latch circuit 171_1. The command decoder 171_3 may decode the latch command address LCA to generate the write command WT_C for a write operation of the second rank 135A and to generate the read command RD_C for a read operation of the second rank 135A. The command decoder 171_3 may be connected to the command detection circuit 171_5 and the buffer control signal generation circuit (BF CTR) 173_1 to apply the write command WT_C to the command detection circuit 171_5 and to apply the read command RD_D to the buffer control signal generation circuit 173_1. The command detection circuit 171_5 may generate a second command control signal C_CTR2 based on the write command WT_C. The command detection circuit 171_5 may generate the second command control signal C_CTR2 that is activated when the write command WT_C is generated for the write operation of the second rank 135A. The command detection circuit 171_5 may be connected to the termination control circuit 175 to apply the second command control signal C_CTR2 to the termination control circuit 175.

The dynamic control signal generation circuit 173 may generate a second dynamic control signal D_CTR2 that is enabled to set a termination resistance value of the second rank 135A to a preset dynamic resistance value (D_ODT in FIG. 4) based on the first read strobe signal RDQS1 and the second read strobe signal RDQS2 in a state in which the write operation of the first rank 135A is performed and the dynamic termination mode or the high-frequency mode is entered. To this end, the dynamic control signal generation circuit 173 may include a buffer control circuit (BF_CTR) 173_1, a buffer circuit 173_3, and a read strobe signal detection circuit (RDQS DET) 173_5. The buffer control circuit 173_1 may generate a second buffer enable signal BF_ON2 based on a dynamic termination mode signal MD_DODT, a high-frequency mode signal HF_MR, and the read command RD_C. The buffer control circuit 173_1 may generate the second buffer enable signal BF_ON2 that is activated when entering the dynamic termination mode by the dynamic termination mode signal MD_DODT or entering the high-frequency mode by the high-frequency mode signal HF_MR. The buffer control circuit 173_1 may generate the second buffer enable signal BF_ON2 that is deactivated at a time point when a preset buffer control period elapses when a read operation for the second rank 135A is performed and the read command RD_C is generated. The buffer control circuit 173_1 may be connected to the buffer circuit 173_3 to apply the second buffer enable signal BF_ON2 to the buffer circuit 173_3. The buffer circuit 173_3 may receive the first read strobe signal RDQS1 and the second read strobe signal RDQS2 to generate a first internal read strobe signal IRDQS1 and a second internal read strobe signal IRDQS2 based on the second buffer enable signal BF_ON2. The buffer circuit 173_3 may buffer the first read strobe signal RDQS1 to generate the first internal read strobe signal IRDQS1 and may buffer the second read strobe signal RDQS2 to generate the second internal read strobe signal IRDQS2 when the second buffer enable signal BF_ON2 is activated. The buffer circuit 173_3 may be connected to the read strobe signal detection circuit 173_5 to apply the first internal read strobe signal IRDQS1 and the second internal read strobe signal IRDQS2 to the read strobe signal detection circuit 173_5. The read strobe signal detection circuit 173_5 may generate the second dynamic control signal D_CTR2 based on the first internal read strobe signal IRDQS1 and the second internal read strobe signal IRDQS2. More specifically, the read strobe signal detection circuit 173_5 may generate the second dynamic control signal D_CTR2 that is activated when each of the first internal read strobe signal IRDQS1 and the second internal read strobe signal IRDQS2 is set to have a preset logic level. For example, the read strobe signal detection circuit 173_5 may generate the second dynamic control signal D_CTR2 that is activated when both the first internal read strobe signal IRDQS1 and the second internal read strobe signal IRDQS2 are set to have a logic "high" level. The logic level of each of the first internal read strobe signal IRDQS1 and the second internal read strobe signal IRDQS2 set to activate the second dynamic control signal D_CTR2 may be variously set according to embodiments. The read strobe signal detection circuit 173_5 may be connected to the termination control circuit 175 to apply the second dynamic control signal D_CTR2 to the termination control circuit 175.

The termination control circuit 175 may generate a second termination resistance calibration signal ODT_S2 to adjust the termination resistance value of the termination circuit 177 based on the second command control signal C_CTR2 received from the command detection circuit 171_5 and the second dynamic control signal D_CTR2 received from the read strobe signal detection circuit 173_5. The termination control circuit 175 may generate a second termination resistance calibration signal ODT_S2 to calibrate a termination resistance value of the termination circuit 177 to a target resistance value (T_ODT in FIG. 4) when the second command control signal C_CTR2 is activated and the second dynamic control signal D_CTR2 is deactivated. The termination control circuit 175 may generate a second termination resistance calibration signal ODT_S2 to calibrate the termination resistance value of the termination circuit 177 to a dynamic resistance value (D_ODT in FIG. 4) when the second command control signal C_CTR2 is deactivated and the second dynamic control signal D_CTR2 is activated. The termination control circuit 175 may generate a second termination resistance calibration signal ODT_S2 to calibrate the termination resistance value of the termination circuit 177 to a non-target resistance value (NT_ODT in FIG. 4) when the second command control signal C_CTR2 is deactivated and the second dynamic control signal D_CTR2 is deactivated. The termination resistance value of the termination circuit 177 may be set to a resistance value of a termination resistor (not shown) provided in the second rank 135A. The termination resistance value of the termination circuit 177 may be implemented to be set to one of the target resistance value (T_ODT in FIG. 4), the dynamic resistance value (D_ODT in FIG. 4), and the non-target resistance value (NT_ODT in FIG. 4) by calibrating the logic bit set of bits included in the second termination resistance calibration signal ODT_S2 or by calibrating the voltage level of the termination resistance calibration signal ODT_S1.

Figure 4:
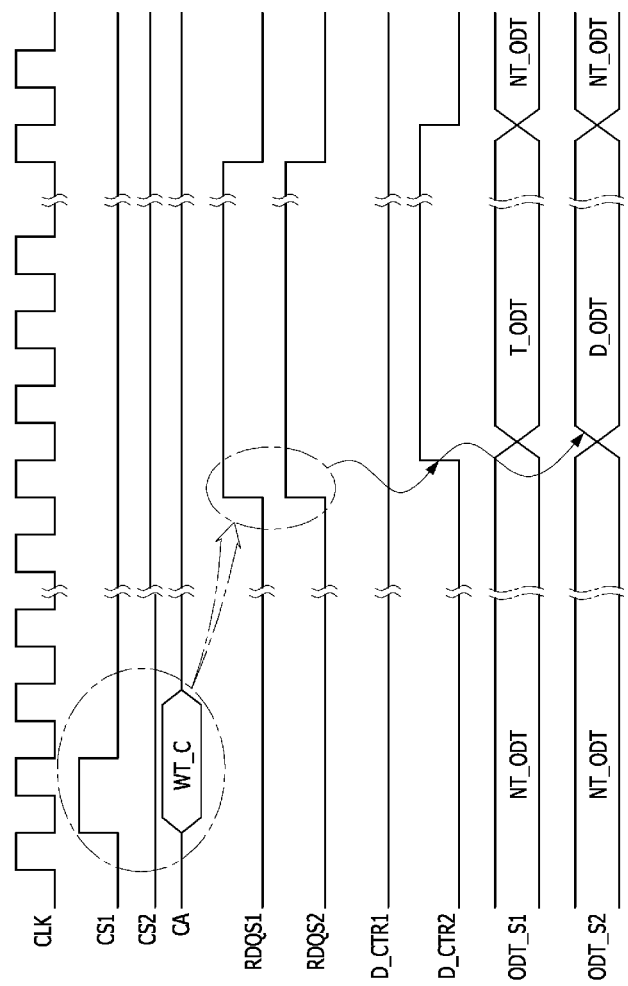
FIGS. 4, 5, and 6 are timing diagrams illustrating an operation in which a termination resistance value is calibrated in a semiconductor system according to an embodiment.
Figure 5:
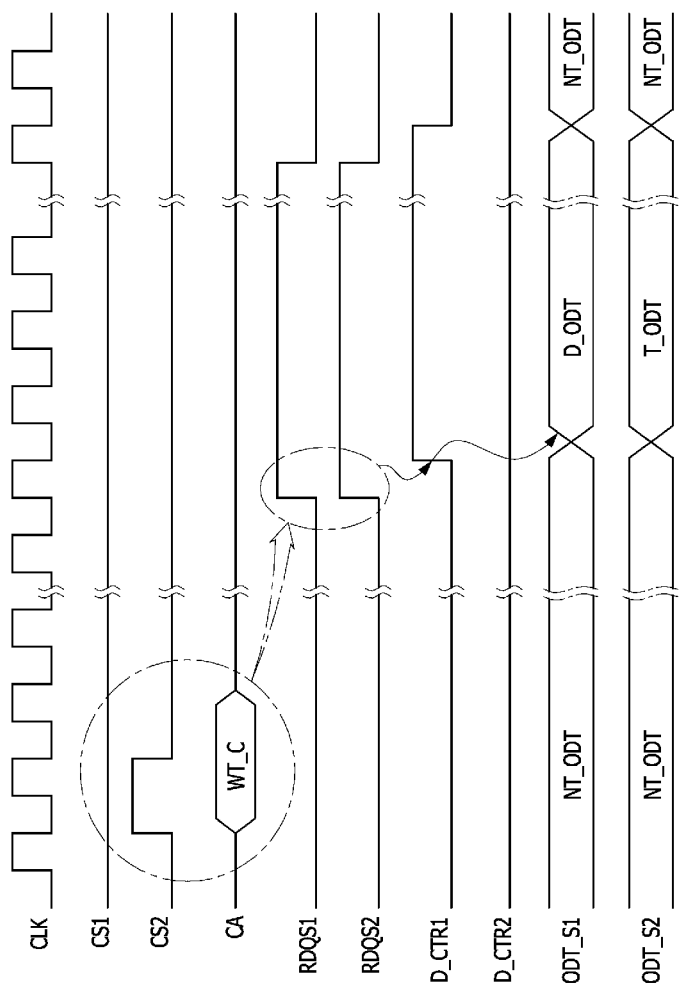
Figure 6:
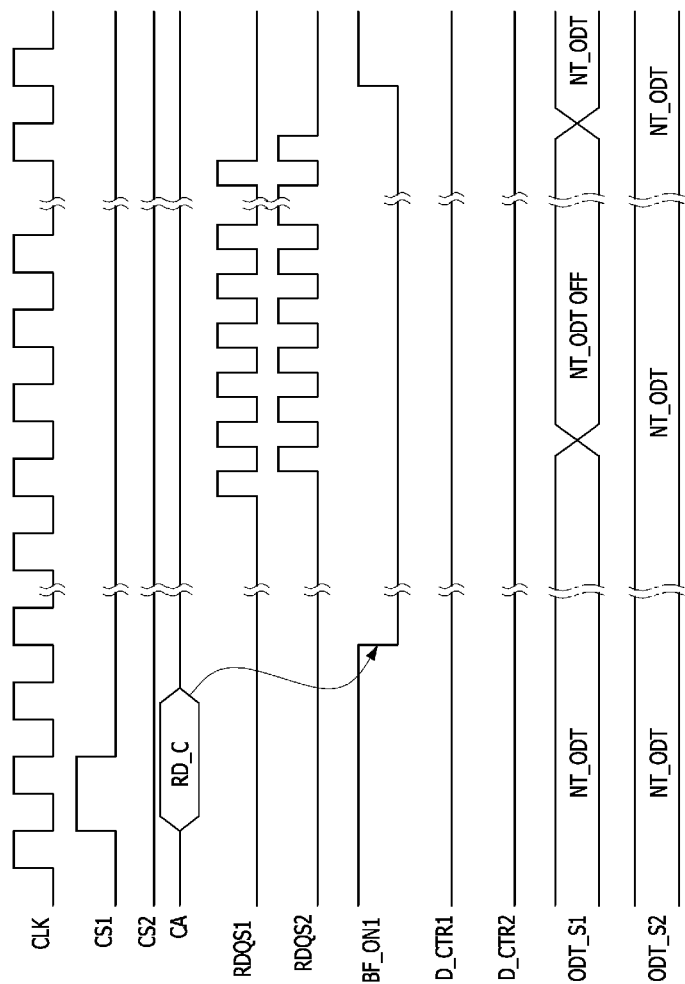

FIGS. 4 to 6 are timing diagrams illustrating an operation in which a termination resistance value is calibrated in a semiconductor system 1 according to an embodiment of the present disclosure. Referring to FIGS. 4 to 6, when a write operation on the first rank 133A shown in FIG. 2 is performed, a case in which a write operation on the second rank 135A illustrated in FIG. 3 is performed, and a case in which a read operation on the rank 133A is performed will be described as follows.

As shown in FIG. 4, when a first chip selection signal CS1 is activated at a logic "high" level, a write command WT_C is generated from a command address CA in synchronization with a clock CLK, and the write operation on the first rank 133A is performed, a first termination resistance calibration signal ODT_S1 for setting a termination resistance value of the first rank 133A to a preset target resistance value T_ODT may be generated.

Meanwhile, as shown in FIG. 4, when the write operation on the first rank 133A is performed, and a first read strobe signal RDQS1 and a second read strobe signal RDQS2 both set to have a logic "high" level are received, a second dynamic control signal D_CTR2 that is activated at a logic "high" level may be generated. When the second dynamic control signal D_CTR2 is activated at a logic "high" level, a second termination resistance calibration signal ODT_S2 may be generated for setting the termination resistance value of the second rank 135A to the preset dynamic resistance value D_ODT.

As shown in FIG. 5, when a second chip select signal CS2 is activated at a logic "high" level, a write command WT_C is generated from the command address CA in synchronization with the clock CLK, and a write operation on the second rank 135A is performed, a second termination resistance calibration signal ODT_S2 for setting the termination resistance value of the second rank 135A to a preset target resistance value T_ODT may be generated.

Meanwhile, as shown in FIG. 5, when the write operation on the second rank 135A is performed and the first read strobe signal RDQS1 and the second read strobe signal RDQS2 both set to have a logic "high" level are received, a first dynamic control signal D_CTR1 that is activated at a logic "high" level may be generated. When the first dynamic control signal D_CTR1 is activated at a logic "high" level, a first termination resistance calibration signal ODT_S1 for setting the termination resistance value of the first rank 133A to the preset dynamic resistance value D_ODT may be generated.

As shown in FIG. 6, when the first chip selection signal CS1 is activated at a logic "high" level, a read command RD_C is generated from the command address CA in synchronization with the clock CLK, and a read operation on the first rank 133A is performed, a second termination resistance calibration signal ODT_S2 may be generated to maintain the termination resistance value of the first rank 133A as a non-target resistance value NT_ODT.

Meanwhile, because the first buffer enable signal BF_ON1 is deactivated by the read command RD_C when the read operation on the first rank 133A is performed, the buffer circuit 153_3 that receives the first read strobe signal RDQS1 and a second read strobe signal RDQS2 may be deactivated. Because the operation of setting the termination resistance value of the first rank 133A to the non-target resistance value NT_ODT by the second termination resistance calibration signal ODT_S2 is terminated in a state in which the buffer circuit 153_3 is deactivated, power consumed to set the termination resistance value of the first rank 133 may be reduced. Meanwhile, when the read operation on the first rank 133A is performed and the toggling first read strobe signal RDQS1 and second read strobe signal RDQS2 are received, the first dynamic control signal D_CTR1 and the second dynamic control signal D_CTR2 both deactivated at a logic "low" level may be generated. When the second dynamic control signal D_CTR2 is deactivated at a logic "low" level, the termination resistance value of the second rank 135A may be maintained as the non-target resistance value NT_ODT.

Figure 7:
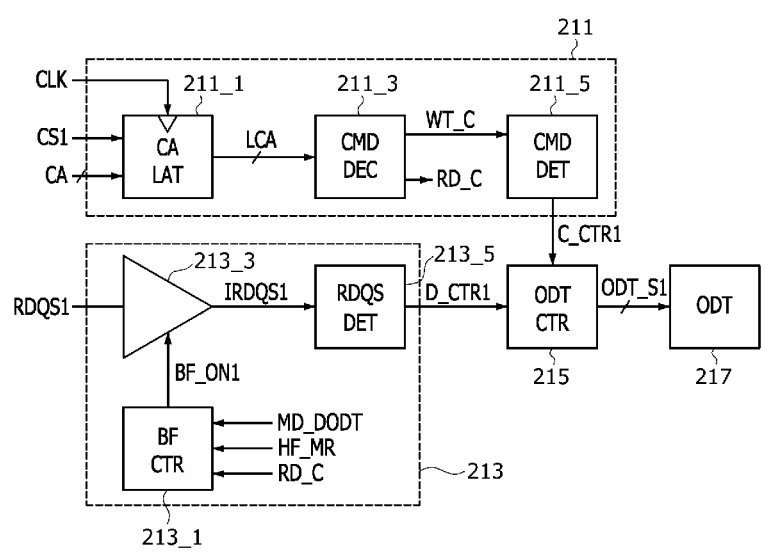
FIG. 7 is a block diagram illustrating a configuration of a first rank according to another embodiment of the present disclosure.

FIG. 7 is a block diagram illustrating a configuration of a first rank 133B according to another example of the first rank 133 shown in FIG. 1. As shown in FIG. 7, the first rank 133B may include a command control signal generation circuit 211, a dynamic control signal generation circuit 213, a termination control circuit 215, and a termination circuit 217.

The command control signal generation circuit 211 may generate a first command control signal C_CTR1 that is activated when a write operation of the first rank 133B is performed. To this end, the command control signal generation circuit 211 may include a command address latch circuit (CA LAT) 211_1, a command decoder (CMD DEC) 211_3, and a command detection circuit (CMD DET) 211_5. The command address latch circuit 211_1 may generate a latch command address LCA from a command address CA based on a clock CLK and a first chip selection signal CS1. The command address latch circuit 211_1 may latch the command address CA in synchronization with the clock CLK and may output the latched command address CA as a latch command address LCA when the first chip selection signal CS1 is activated for various internal operations including a write operation, a read operation, and the like of the first rank 133B. The command address latch circuit 211_1 may be connected to the command decoder 211_3 to apply the latch command address LCA to the command decoder 211_3. The command decoder 211_3 may generate a write command WT_C and a read command RD_C from the latch command address LCA that is received from the command address latch circuit 211_1. The command decoder 211_3 may decode the latch command address LCA to generate the write command WT_C for the write operation of the first rank 133B and to generate the read command RD_C for the read operation of the first rank 133B. The command decoder 211_3 may be connected to the command detection circuit 211_5 and the buffer control signal generation circuit (BF CTR) 213_1 to apply the write command WT_C to the command detection circuit 211_5 and to apply the read command RD_C to the buffer control signal generation circuit 213_1. The command detection circuit 211_5 may generate a first command control signal C_CTR1 based on the write command WT_C. The command detection circuit 211_5 may generate the first command control signal C_CTR1 that is activated when the write command WT_C is generated for the write operation of the first rank 133B. The command detection circuit 211_5 may be connected to the termination control circuit 215 to apply the first command control signal C_CTR1 to the termination control circuit 215.

The dynamic control signal generation circuit 213 may generate a first dynamic control signal D_CTR1 that is enabled to set a termination resistance value of the first rank 133B to a preset dynamic resistance value D_ODT, based on a read strobe signal RDQS1 in a state in which a write operation of a second rank (135 in FIG. 1) is performed and a dynamic termination mode or a high-frequency mode is entered. To this end, the dynamic control signal generation circuit 213 may include a buffer control circuit (BF_CTR) 213_1, a buffer circuit 213_3, and a read strobe signal detection circuit (RDQS DET) 213_5. The buffer control circuit 213_1 may generate a first buffer enable signal BF_ON1 based on a dynamic termination mode signal MD_DODT, a high-frequency mode signal HF_MR, and a read command RD_C. The buffer control circuit 213_1 may generate the first buffer enable signal BF_ON1 that is activated when entering a dynamic termination mode by the dynamic termination mode signal MD_DODT or entering a high-frequency mode by the high-frequency mode signal HF_MR. The buffer control circuit 213_1 may generate the first buffer enable signal BF_ON1 that is deactivated at a time point when a preset buffer control period elapses when a read operation on the first rank 133B is performed and the read command RD_C is generated. The buffer control period may be set in consideration of a period in which the first read strobe signal RDQS1 is received in order to calibrate the termination resistance value. The buffer control circuit 213_1 may be connected to the buffer circuit 213_3 to apply the first buffer enable signal BF_ON1 to the buffer circuit 213_3. The buffer circuit 213_3 may receive the first read strobe signal RDQS1 based on the first buffer enable signal BF_ON1 to generate a first internal read strobe signal IRDQS1. The buffer circuit 213_3 may buffer the first read strobe signal RDQS1 to generate the first internal read strobe signal IRDQS1 when the first buffer enable signal BF_ON1 is activated. The buffer circuit 213_3 may be connected to the read strobe signal detection circuit 213_5 to apply the first internal read strobe signal IRDQS1 to the read strobe signal detection circuit 213_5. The read strobe signal detection circuit 213_5 may generate the first dynamic control signal D_CTR1 based on the first internal read strobe signal IRDQS1. More specifically, the read strobe signal detection circuit 213_5 may generate the first dynamic control signal D_CTR1 that is activated when the first internal read strobe signal IRDQS1 is set to have a preset logic level. For example, the read strobe signal detection circuit 213_5 may generate the first dynamic control signal D_CTR1 that is activated when the first internal read strobe signal IRDQS1 is set to have a logic "high" level. The logic level of the first internal read strobe signal IRDQS1 set to activate the first dynamic control signal D_CTR1 may be variously set according to embodiments. The read strobe signal detection circuit 213_5 may be connected to the termination control circuit 215 to apply the first dynamic control signal D_CTR1 to the termination control circuit 215.

The termination control circuit 215 may generate a first termination resistance calibration signal ODT_S1 to calibrate a termination resistance value of the termination circuit 217, based on the first command control signal C_CTR1 that is received from the command detection circuit 211_5 and the first dynamic control signal D_CTR1 that is received from the read strobe signal detection circuit 213_5. The termination control circuit 215 may generate the first termination resistance calibration signal ODT_S1 for calibrating the termination resistance value of the termination circuit 217 to a target resistance value T_ODT when the first command control signal C_CTR1 is activated and the first dynamic control signal D_CTR1 is deactivated. The termination control circuit 215 may generate the first termination resistance calibration signal ODT_S1 for calibrating the termination resistance value of the termination circuit 217 to a dynamic resistance value D_ODT when the first command control signal C_CTR1 is deactivated and the first dynamic control signal D_CTR1 is activated. The termination control circuit 215 may generate the first termination resistance calibration signal ODT_S1 for calibrating the termination resistance value of the termination circuit 217 to a non-target resistance value NT_ODT when the first command control signal C_CTR1 is deactivated and the first dynamic control signal D_CTR1 is deactivated. The termination resistance value of the termination circuit 217 may be implemented to be set to one of the target resistance value T_ODT, the dynamic resistance value D_ODT, and the non-target resistance value NT_ODT by calibrating the logic bit set of bits included in the first termination resistance calibration signal ODT_S1 or by calibrating a voltage level of the first termination resistance calibration signal ODT_S1.

Figure 8:
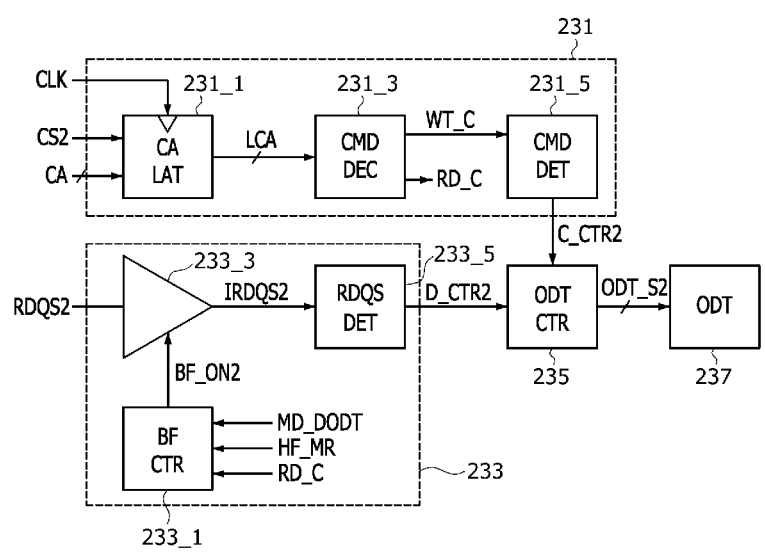
FIG. 8 is a block diagram illustrating a configuration of a second rank according to another embodiment of the present disclosure.

FIG. 8 is a block diagram illustrating a configuration of a second rank 135B according to another example of the second rank 135 shown in FIG. 1. As shown in FIG. 8, the second rank 135B may include a command control signal generation circuit 231, a dynamic control signal generation circuit 233, a termination control circuit 235, and a termination circuit 237.

The command control signal generation circuit 231 may generate a second command control signal C_CTR2 that is activated when a write operation of the second rank 135B is performed. To this end, the command control signal generation circuit 231 may include a command address latch circuit (CA LAT) 231_1, a command decoder (CMD DEC) 231_3, and a command detection circuit (CMD DET) 231_5. The command address latch circuit 231_1 may generate a latch command address LCA from a command address CA based on a clock CLK and a second chip selection signal CS2. The command address latch circuit 231_1 may latch the command address CA in synchronization with the clock CLK and may output the latched command address CA as the latch command address LCA when the second chip selection signal CS2 is activated for various internal operations including a write operation and a read operation of the second rank 135B. The command decoder 231_3 may generate a write command WT_C and a read command RD_C from the latch command address LCA that is received from the command address latch circuit 231_1. The command decoder 231_3 may decode the latch command address LCA to generate the write command WT_C for a write operation of the second rank 135B and may generate the read command RD_C for a read operation of the second rank 135B. The command decoder 231_3 may be connected to the command detection circuit 231_5 and the buffer control signal generation circuit (BF CTR) 233_1 to apply the write command WT_C to the command detection circuit 231_5 and to apply the read command RD_C to the buffer control signal generation circuit 233_1. The command detection circuit 231_5 may generate a second command control signal C_CTR2 based on the write command WT_C. The command detection circuit 231_5 may generate the second command control signal C_CTR2 that is activated when the write command WT_C is generated for the write operation of the second rank 135B. The command detection circuit 231_5 may be connected to the termination control circuit 235 to apply the second command control signal C_CTR2 to the termination control circuit 235.

The dynamic control signal generation circuit 233 may generate a second dynamic control signal D_CTR2 that is enabled to set a termination resistance value of the second rank 135B to a preset dynamic resistance value D_ODT based on a second read strobe signal RDQS2 in a state in which the write operation of the first rank 133B is performed and the dynamic termination mode or the high-frequency mode is entered. To this end, the dynamic control signal generation circuit 233 may include a buffer control circuit (BF_CTR) 233_1, a buffer circuit 233_3, and a read strobe signal detection circuit (RDQS DET) 233_5. The buffer control circuit 233_1 may generate a second buffer enable signal BF_ON2 based on a dynamic termination mode signal MD_DODT, a high-frequency mode signal HF_MR, and a read command RD_C. The buffer control circuit 233_1 may generate the second buffer enable signal BF_ON2 that is activated when entering a dynamic termination mode by the dynamic termination mode signal MD_DODT or when entering a high-frequency mode by the high-frequency mode signal HF_MR. The buffer control circuit 233_1 may generate the second buffer enable signal BF_ON2 that is deactivated at a time point when a preset buffer control period elapses when the read operation for the second rank 135B is performed and the read command RD_C is generated. The buffer control circuit 233_1 may be connected to the buffer circuit 233_3 to apply the second buffer enable signal BF_ON2 to the buffer circuit 233_3. The buffer circuit 233_3 may receive the second read strobe signal RDQS2 based on the second buffer enable signal BF_ON2 to generate a second internal read strobe signal IRDQS2. The buffer circuit 233_3 may buffer the second read strobe signal RDQS2 to generate the second internal read strobe signal IRDQS2 when the second buffer enable signal BF_ON2 is activated. The buffer circuit 233_3 may be connected to the read strobe signal detection circuit 233_5 to apply the second internal read strobe signal IRDQS2 to the read strobe signal detection circuit 233_5. The read strobe signal detection circuit 233_5 may generate the second dynamic control signal D_CTR2 based on the second internal read strobe signal IRDQS2. More specifically, the read strobe signal detection circuit 233_5 may generate the second dynamic control signal D_CTR2 that is activated when the second internal read strobe signal IRDQS2 is set to have a preset logic level. For example, the read strobe signal detection circuit 233_5 may generate the second dynamic control signal D_CTR2 that is activated when the second internal read strobe signal IRDQS2 is set to have a logic "high" level. The logic level of the second internal read strobe signal IRDQS2 that is set to activate the second dynamic control signal D_CTR2 may be variously set according to embodiments. The read strobe signal detection circuit 233_5 may be connected to the termination control circuit 235 to apply the second dynamic control signal D_CTR2 to the termination control circuit 235.

The termination control circuit 235 may generate a second termination resistance calibration signal ODT_S2 to calibrate a termination resistance value of the termination circuit 237 based on the second command control signal C_CTR2 received from the command detection circuit 231_5 and the second dynamic control signal D_CTR2 received from the read strobe signal detection circuit 233_5. The termination control circuit 235 may generate the second termination resistance calibration signal ODT_S2 to calibrate the termination resistance value of the termination circuit 237 to a target resistance value T_ODT when the second command control signal C_CTR2 is activated and the second dynamic control signal D_CTR2 is deactivated. The termination control circuit 235 may generate the second termination resistance calibration signal ODT_S2 to calibrate the termination resistance value of the termination circuit 237 to a dynamic resistance value D_ODT when the second command control signal C_CTR2 is deactivated and the second dynamic control signal D_CTR2 is activated. The termination control circuit 235 may generate the second termination resistance calibration signal ODT_S2 to calibrate the termination resistance value of the termination circuit 237 to a non-target resistance value NT_ODT when the second command control signal C_CTR2 is deactivated and the second dynamic control signal D_CTR2 is deactivated. The termination resistance value of the termination circuit 237 may be implemented to be set to one of the target resistance value T_ODT, the dynamic resistance value D_ODT, and the non-target resistance value NT_ODT by calibrating the logic bit set of bits included in the second termination resistance calibration signal ODT_S2 or by calibrating the voltage level of the termination resistance calibration signal ODT_S1.

Figure 9:
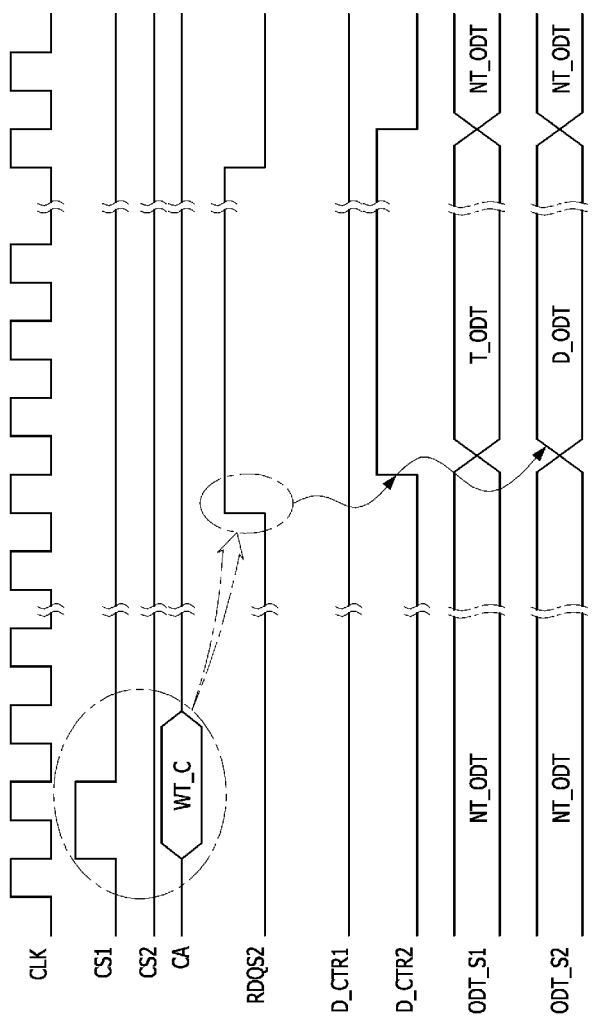
FIG. 9 is a timing diagram illustrating an operation in which a termination resistance value is calibrated in a semiconductor system according to another embodiment of the present disclosure.

FIG. 9 is a timing diagram illustrating an operation in which a termination resistance value is calibrated in a semiconductor system according to another embodiment of the present disclosure. Referring to FIG. 9, when a write operation for the first rank 133B shown in FIG. 7 is performed, the write operation may proceed as follows.

As shown in FIG. 9, when a first chip selection signal CS1 is activated at a logic "high" level, a write command WT_C is generated from a command address CA in synchronization with a clock CLK, and the write operation for the first rank 133B is performed, a first termination resistance calibration signal ODT_S1 for setting a termination resistance value of the first rank 133B to a preset target resistance value T_ODT may be generated.

Meanwhile, as shown in FIGS. 8 and 9, when the write operation on the first rank 133B is performed and a second read strobe signal RDQS2 set to have a logic "high" level is received, a second dynamic control signal D_CTR2 that is activated at a logic "high" level may be generated. When the second dynamic control signal D_CTR2 is activated at a logic "high" level, a second termination resistance calibration signal ODT_S2 may be generated for setting a termination resistance value of a second rank 135B to a preset dynamic resistance value D_ODT.

Figure 10:
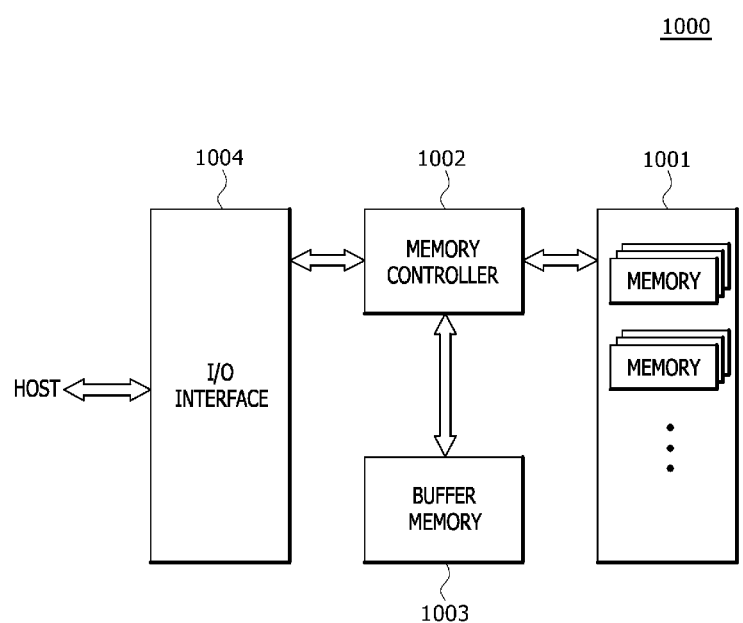
FIG. 10 is a block diagram illustrating a configuration of an electronic system according to an embodiment of the present disclosure.

The semiconductor system 1 described above in FIG. 1 may be applied to an electronic system including a memory system, a graphic system, a computing system, and a mobile system. For example, referring to FIG. 10, an electronic system 1000 according to an embodiment of the present disclosure may include a data storage 1001, a memory controller 1002, a buffer memory 1003, and an input/output (I/O) interface 1004.

The data storage 1001 may store data (not shown) that is applied from the memory controller 1002 according to a control signal from the memory controller 1002, and may read out stored data (not shown) to output the data to the memory controller 1002. Meanwhile, the data storage 1001 may include non-volatile memory devices capable of continuously storing data without losing data even when power is cut off. The non-volatile memory device may include a flash memory device (NOR flash memory device, NAND flash memory device), a phase change random access memory (PRAM) device, a resistive random access memory (RRAM) device, a spin transfer torque random access memory (STTRAM) device, or a magnetic random access memory (MRAM) device.

The memory controller 1002 may decode instructions applied from an external device (a host device) through the I/O interface 1004, and may control data input and output for the data storage 1001 and the buffer memory 1003 according to a decoding result. Although the memory controller 1002 is represented as one block in FIG. 10, a controller for controlling the data storage 1001 and a controller for controlling the buffer memory 1003 which is a volatile memory device may be configured independently in the memory controller 1002. The memory controller 1002 may include the controller 11 described above with reference to FIG. 1.

The buffer memory 1003 may temporarily store data to be processed by the memory controller 1002, that is, the data (not shown) that is input or output to or from the data storage 1001. The buffer memory 1003 may store data (not shown) applied from the memory controller 1002 according to a control signal. The buffer memory 1003 may include the semiconductor device 13 described above with reference to FIG. 1. The buffer memory 1003 may read out stored data to output the data to the memory controller 1002. The buffer memory 1003 may include a volatile memory device such as a dynamic random access memory (DRAM) device, a mobile DRAM device, or a static random access memory (SRAM) device.

The I/O interface 1004 may provide physical connection between the memory controller 1002 and an external device (a host device) to enable the memory controller 1002 to receive a control signal for data input/output from the external device and to exchange data with the external device. The I/O interface 1004 may include one of various interface protocols such as universal serial bus (USB), multi-media card (MMC), peripheral component interconnect-express (PCI-E), serial attached SCSI (SAS), serial ATA (SATA), parallel ATA (PATA), small computer system interface (SCSI), enhanced small disk interface (ESDI), integrated drive electronics (IDE), and the like.

The electronic system 1000 may be used as an auxiliary storage device of a host device or an external storage device. The electronic system 1000 may include a solid state disk (SSD), a universal serial bus (USB) memory, a secure digital (SD) card, a mini secure digital (mSD) card, a micro secure digital (micro SD) card, secure digital high capacity (SDHC), a memory stick card, a smart media (SM) card, a multimedia card (MMC), an embedded multimedia card (eMMC), a compact flash (CF) card, and the like.

Figure 11:
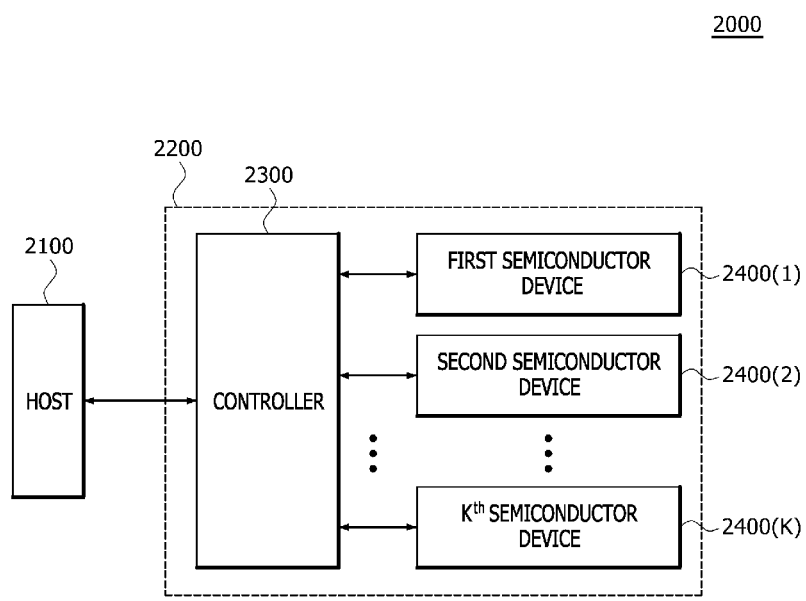
FIG. 11 is a block diagram illustrating a configuration of an electronic system according to another embodiment of the present disclosure.

FIG. 11 is a block diagram illustrating a configuration of an electronic system 2000 according to another embodiment of the present disclosure. As shown in FIG. 11, the electronic system 2000 may include a host 2100 and a semiconductor system 2200.

The host 2100 and the semiconductor system 2200 may transmit signals to each other using interface protocols. The interface protocols used between the host 2100 and the semiconductor system 2200 may include multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1:K). The controller 2300 may include the controller 11 described above with reference FIG. 1. Each of the semiconductor devices 2400 (1:K) may include the semiconductor device 13 described above with reference to FIG. 1. Each of the semiconductor devices 2400(1:K) may be implemented with one of a dynamic random access memory (DRAM) device, a phase change random access memory (PRAM) device, a resistive random access memory (RRAM) device, a magnetic random access memory (MRAM) device, and a ferroelectric random access memory (FRAM) device.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor system comprising:
a controller configured to transmit a command address and a plurality of read strobe signals; and
a semiconductor device including a first rank and a second rank, each of the first rank and the second rank being configured to receive the command address and the plurality of read strobe signals and to perform a write operation and a read operation based on the command address,
wherein the first rank is configured to calibrate a termination resistance value of the first rank to a target resistance value when a write operation for the first rank is performed, and
wherein the first rank is configured to calibrate the termination resistance value of the first rank to a dynamic resistance value based on the plurality of read strobe signals when a write operation for the second rank is performed.

2. The semiconductor system of claim 1, wherein the first rank is configured to calibrate the termination resistance value of the first rank to the dynamic resistance value based on the plurality of read strobe signals in a state in which a dynamic termination mode or a high-frequency mode is entered.

3. The semiconductor system of claim 2, wherein the first rank is configured to calibrate the termination resistance value of the first rank to a non-target resistance value when the write operation for the first rank is not performed or the plurality of read strobe signals are not at a preset logic level.

4. The semiconductor system of claim 1, wherein the first rank is configured to deactivate a buffer circuit that receives the plurality of read strobe signals at a time point when the read operation for the first rank is performed and a preset buffer control period elapses.

5. The semiconductor system of claim 1, wherein the plurality of read strobe signals include a first read strobe signal and a second read strobe signal, and
wherein the first rank is configured to calibrate the termination resistance value of the first rank to the dynamic resistance value when each of the first read strobe signal and the second read strobe signal is at a preset logic level, when the write operation for the second rank is performed.

6. The semiconductor system of claim 1, wherein the first rank includes:

a command control signal generation circuit configured to generate a command control signal that is activated when a write operation of the first rank is performed;

a dynamic control signal generation circuit configured to generate a dynamic control signal based on the plurality of read strobe signals in a state in which a write operation of the second rank is performed and a dynamic termination mode or a high-frequency mode is entered; and a termination control circuit configured to generate a termination resistance calibration signal for calibrating the termination resistance value of the first rank based on the command control signal and the dynamic control signal.

7. The semiconductor system of claim 6, wherein the command control signal generation circuit includes:

a command address latch circuit configured to generate a latch command address from the command address based on a clock and a chip selection signal; and a command detection circuit configured to detect a write command that is generated for the write operation of the first rank by decoding the latch command address to generate the command control signal.

8. The semiconductor system of claim 6, wherein the dynamic control signal generation circuit includes:

a buffer control circuit configured to generate a buffer enable signal based on a dynamic termination mode signal, a high-frequency mode signal, and a read command;

a buffer circuit configured to receive the plurality of read strobe signals based on the buffer enable signal to generate a plurality of internal read strobe signals; and a read strobe signal detection circuit configured to generate the dynamic control signal based on the plurality of internal read strobe signals.

9. The semiconductor system of claim 8, wherein the dynamic termination mode signal is activated in the dynamic termination mode that is entered to set the termination resistance value of a non-target rank to the dynamic resistance value, and wherein the high-frequency mode signal is activated in the high-frequency mode in which an operating frequency is set to be high.

10. The semiconductor system of claim 6, wherein the termination control circuit is configured to:

generate the termination resistance calibration signal for calibrating the termination resistance value of the first rank to the target resistance value when the command control signal is activated and the dynamic control signal is deactivated, generate the termination resistance calibration signal for calibrating the termination resistance value of the first rank to the dynamic resistance value when the command control signal is deactivated and the dynamic control signal is activated, and generate the termination resistance calibration signal for calibrating the termination resistance value of the first rank to a non-target resistance value when the command control signal is deactivated, and the dynamic control signal is deactivated.

11. The semiconductor system of claim 1, wherein the second rank calibrates the termination resistance value of the second rank to the target resistance value when a write operation for the second rank is performed, wherein the second rank calibrates the termination resistance value of the second rank to the dynamic resistance value based on the plurality of read strobe signals when a write operation for the first rank is performed, and wherein the first rank calibrates the termination resistance value of the first rank to a non-target resistance value when the write operation for the first rank is not performed or the plurality of read strobe signals are not at a preset logic level.

12. A semiconductor system comprising:

a controller configured to transmit a command address and a read strobe signals; and a semiconductor device including a first rank and a second rank, each of the first rank and the second rank being configured to receive the command address and the read strobe signals and to perform a write operation and a read operation based on the command address, wherein the first rank is configured to calibrate a termination resistance value of the first rank to a target resistance value when a write operation for the first rank is performed, and wherein the first rank is configured to calibrate the termination resistance value of the first rank to a dynamic resistance value based on the read strobe signals when a write operation for the second rank is performed.

13. The semiconductor system of claim 12, wherein the first rank is configured to calibrate the termination resistance value of the first rank to the dynamic resistance value based on the read strobe signals in a state in which a dynamic termination mode or a high-frequency mode is entered.

14. The semiconductor system of claim 12, wherein the first rank is configured to calibrate the termination resistance value of the first rank to a non-target resistance value when the write operation for the first rank is not performed or the read strobe signals are not at a preset logic level.

15. The semiconductor system of claim 12, wherein the first rank includes:

a command control signal generation circuit configured to generate a command control signal that is activated when the write operation of the first rank is performed;

a dynamic control signal generation circuit configured to generate a dynamic control signal based on the plurality of read strobe signals in a state in which the write operation of the second rank is performed and the dynamic termination mode or the high-frequency mode is entered; and a termination control circuit configured to generate a termination resistance calibration signal for calibrating the termination resistance value of the first rank based on the command control signal and the dynamic control signal.

16. The semiconductor system of claim 15, wherein the dynamic control signal generation circuit includes:

a buffer control circuit configured to generate a buffer enable signal based on a dynamic termination mode signal, a high-frequency mode signal, and a read command;

a buffer circuit configured to receive the plurality of read strobe signals based on the buffer enable signal to generate an internal read strobe signal; and a read strobe signal detection circuit configured to generate the dynamic control signal based on the internal read strobe signal.

17. A semiconductor device comprising:

a first rank and a second rank, each of the first rank and the second rank being configured to perform a write operation and a read operation based on a command address, wherein the first rank is configured to calibrate a termination resistance value of the first rank to a target resistance value when a write operation for the first rank is performed, and wherein the first rank is configured to calibrate the termination resistance value of the first rank to a dynamic resistance value based on at least one read strobe signal when a write operation for the second rank is performed.

18. The semiconductor device of claim 17, wherein the first rank is configured to calibrate the termination resistance value of the first rank to the dynamic resistance value based on the at least one read strobe signal in a state in which a dynamic termination mode or a high-frequency mode is entered.

19. The semiconductor device of claim 17, wherein the first rank is configured to calibrate the termination resistance value of the first rank to a non-target resistance value when the write operation for the first rank is not performed or the at least one read strobe signal is not at a preset logic level.

20. The semiconductor device of claim 17, wherein the first rank includes:
- a command control signal generation circuit configured to generate a command control signal that is activated when the write operation of the first rank is performed;
- a dynamic control signal generation circuit configured to generate a dynamic control signal based on the at least one read strobe signal in a state in which the write operation of the second rank is performed and the dynamic termination mode or the high-frequency mode is entered; and
- a termination control circuit configured to generate a termination resistance calibration signal for calibrating the termination resistance value of the first rank based on the command control signal and the dynamic control signal.

* * * * *